(12) United States Patent
Li et al.

(10) Patent No.: US 8,642,395 B2
(45) Date of Patent: Feb. 4, 2014

(54) METHOD OF MAKING CHIP-ON-LEAD PACKAGE

(75) Inventors: Zhe Li, Tianjin (CN); Qingchun He, Tianjin (CN); Guanhua Wang, Tianjian (CN); Zhijie Wang, Tianjin (CN); Nan Xu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 757 days.

(21) Appl. No.: 12/727,258

(22) Filed: Mar. 19, 2010

(65) Prior Publication Data

US 2010/0248426 A1    Sep. 30, 2010

(30) Foreign Application Priority Data

Mar. 30, 2009   (CN) .......................... 2009 1 0130250

(51) Int. Cl.
   *H01L 21/60*    (2006.01)
   *H01L 21/56*    (2006.01)
   *H01L 33/62*    (2010.01)

(52) U.S. Cl.
   USPC .... 438/123; 438/124; 257/666; 257/E23.039; 257/E33.066

(58) Field of Classification Search
   None
   See application file for complete search history.

(56) References Cited

U.S. PATENT DOCUMENTS

| 5,886,405 | A | 3/1999 | Kim |
| 7,619,307 | B1 | 11/2009 | Wang |
| 2005/0056918 | A1* | 3/2005 | Jeun et al. ...................... 257/678 |
| 2008/0073781 | A1* | 3/2008 | Chen et al. ..................... 257/735 |
| 2008/0290487 | A1 | 11/2008 | Zhao |
| 2009/0098686 | A1* | 4/2009 | Xu et al. ........................ 438/123 |
| 2009/0236710 | A1 | 9/2009 | Hsieh |
| 2010/0087024 | A1* | 4/2010 | Hawat et al. .................... 438/51 |

FOREIGN PATENT DOCUMENTS

JP    08-037252    *    2/1996   .............. H01L 23/12

* cited by examiner

*Primary Examiner* — Zandra Smith
*Assistant Examiner* — Pamela E Perkins
(74) *Attorney, Agent, or Firm* — Charles Bergere

(57) ABSTRACT

A process for assembling a Chip-On-Lead packaged semiconductor device includes the steps of: mounting and sawing a wafer to provide individual semiconductor dies; performing a first molding operation on a lead frame; depositing epoxy on the lead frame via a screen printing process; attaching one of the singulated dies on the lead frame with the epoxy, where the die attach is done at room temperature; and curing the epoxy in an oven. Throughput improvements may be ascribed to not including a hot die attach process. An optional plasma cleaning step may be performed, which greatly improves wire bonding quality and a second molding quality. In addition, since a first molding operation is performed before the formation of epoxy to avoid the problem of the epoxy hanging in the air, the delamination risk between the epoxy and the die is avoided.

8 Claims, 3 Drawing Sheets

METHOD OF MAKING CHIP-ON-LEAD PACKAGE

BACKGROUND OF THE INVENTION

The present invention generally relates to semiconductor packaging processes, and more particularly, to a new process for making a Chip-On-Lead (COL) type package.

U.S. patent publication no. 2008/290487 discloses a lead frame for a semiconductor device and a method of packaging a semiconductor device. The lead frame has at least one row of contact terminals, a die pad for receiving an integrated circuit (IC) die, a wire for connecting the contact terminals and a bonding pad of the IC die, and a polymer isolation material. The IC die is attached to a top surface of the die pad, and then bonding pads of the IC die are electrically connected to respective ones of the contact terminals. Then the die, electrical connections, and at least a top surface of the contact terminals are encapsulated with a mold compound.

In a Chip-On-Lead (COL) package, a die is mounted directly to the pins or lead fingers of a lead frame with non-conductive epoxy. Wire bonding is then performed to electrically connect the die and lead fingers, and then molding is performed to forma standard package configuration, as shown in FIG. 1, for example.

The COL package technology has the following advantages: larger die size into the existing package; no wafer pumping required; comparable thermal performance; and qualified production.

A conventional method for assembling a COL package is shown in FIG. 2. Beginning at step 207, an epoxy screen printing is performed on a Silicon wafer. Then, at step 209, a B-stage epoxy cure is performed. At step 211, the wafer is mounted on a jig and sawn into individual dies. After the incoming of the lead frame, at step 201, the frame leads are taped. With respect to the wafer that has been mounted and sawn and the lead frame that has been taped, at step 213, a hot die attach is performed. During the hot die attach process, a silver slurry is cured at the B-stage epoxy curing step. The silver slurry then must be re-melted at the hot die attach step 213, and a hot die attach at a predetermined temperature is performed. At step 215, an epoxy oven cure is performed. Then, at step 219, wire bonding is performed. After the wire bonding, at step 221, a molding operation is performed. After molding, a marking process is performed at step 223, followed by detaping at step 205. Detaping is followed by some standard remaining backend (B/E) processes, at step 225.

In the existing COL packaging process, as mentioned above, the silver slurry is cured during the B-stage epoxy process, so this process must be extended in order to properly heat the silver slurry. Thus, one drawback with the current COL packaging process is that the process has comparatively low units per hour (UPH) versus assembly of other package types.

Also in the conventional COL packaging process, the mold compound process is completed after the completion of the epoxy cure. That is to say, turning back to FIG. 1, after completion of the epoxy cure at step 209, since the mold compound at the reverse T-shape location may not have finished, the epoxy hangs in the air in the region of the reverse T-shape. Accordingly, a potential delamination risk exists between the epoxy and the die.

In addition, an organic pollutant may be created between the surface of the die and the surface of the lead frame. If the pollutant is cleaned or removed, the bonding process will be greatly improved. However, in the existing process, since the taping is performed, if the cleaning is performed, the layer on the surface of the taping will also undergo a reaction, which, disadvantageously, introduces a new pollution source.

Accordingly, the present invention provides a new COL packaging process that does not have the above-mentioned disadvantage.

DETAILED DESCRIPTION OF THE INVENTION

The embodiments of the present invention are described in detail below by taking the illustrations of the drawings into consideration, so that those skilled in the art can understand the present invention and the advantages of the present invention.

In order to avoid the above disadvantages mentioned above, the present invention provides a new process flow for a COL package.

According to the present invention, a method of forming a Chip-On-Lead package is provided, including the steps of: mounting and sawing a wafer to provide a plurality of singulated dies; performing a first molding operation on a lead frame; depositing epoxy on the lead frame via a screen printing process; attaching one of the singulated dies on the lead frame with the epoxy, wherein the die attach is done at room temperature; and curing the epoxy with an oven.

In one embodiment, the method also includes: taping the lead frame before the first molding operation; and detaping the lead frame after the first molding operation.

In one embodiment, the method includes: electrically connecting the die to the lead frame via wire bonding; and performing a second molding operation to cover the lead frame and the die with a mold compound. Preferably, the first molding operation is performed before the steps of screen printing and die attaching, and the second molding operation is performed after the wire bonding step. Preferably, the electrically connecting step comprises the step of connecting a bond pad of the die to a contact terminal of the lead frame via wire bonding.

In one embodiment, the method also includes the step of plasma cleaning a surface of the die and a surface of the lead frame, preferably before the wire bonding step.

In yet another embodiment, the present invention includes marking a surface of the die.

By means of the above technical solution, the present invention successfully solves the problem of the bottle-neck process in the existing COL package, i.e., the problem of hot die attach no longer exists in the present invention, thereby improving units per hour (UPH). Additionally, the optional plasma cleaning step is performed before the wire bonding and the second molding, thereby improving wire bond ball bond-ability. Further, since the first molding is performed before the formation of the epoxy, the problem of epoxy hanging in the air and causing a risk of delamination is avoided.

Figure 3:
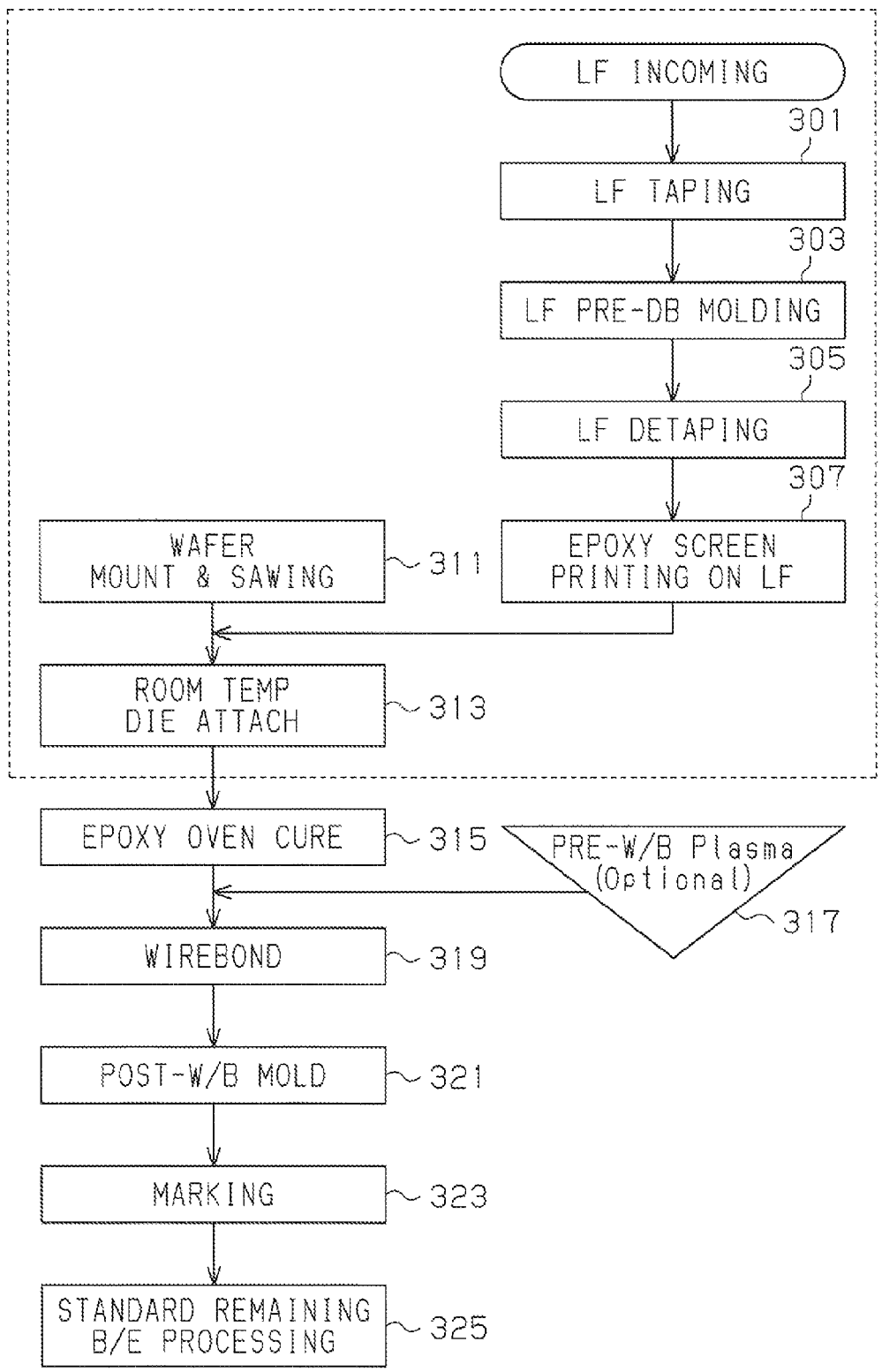
FIG. 3 is a flow chart of a method of assembling a COL package according to an embodiment of the present invention.

FIG. 3 is a flow chart of a Chip-On-Lead (COL) package formed according to an embodiment of the present invention.

After the incoming of the lead frame, in step 301, the lead frame is taped. Then, in step 303, a molding of the lead frame is performed. In order to be distinguished from a second molding operation, the molding herein is called the first molding operation, i.e., the molding before the die attaching.

Figure 1:
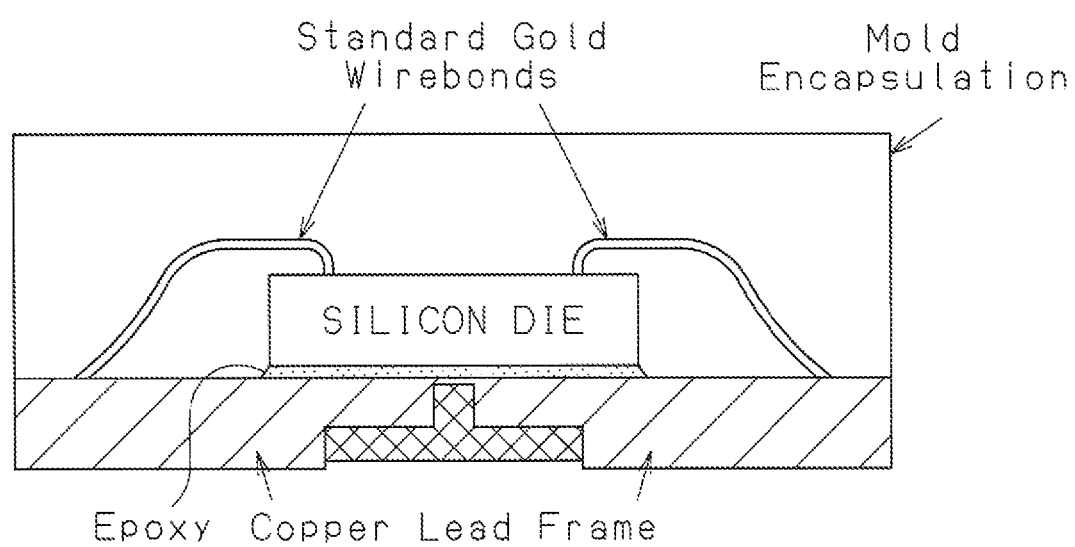
FIG. 1 is a cross-sectional illustration of a COL package.
Figure 2:
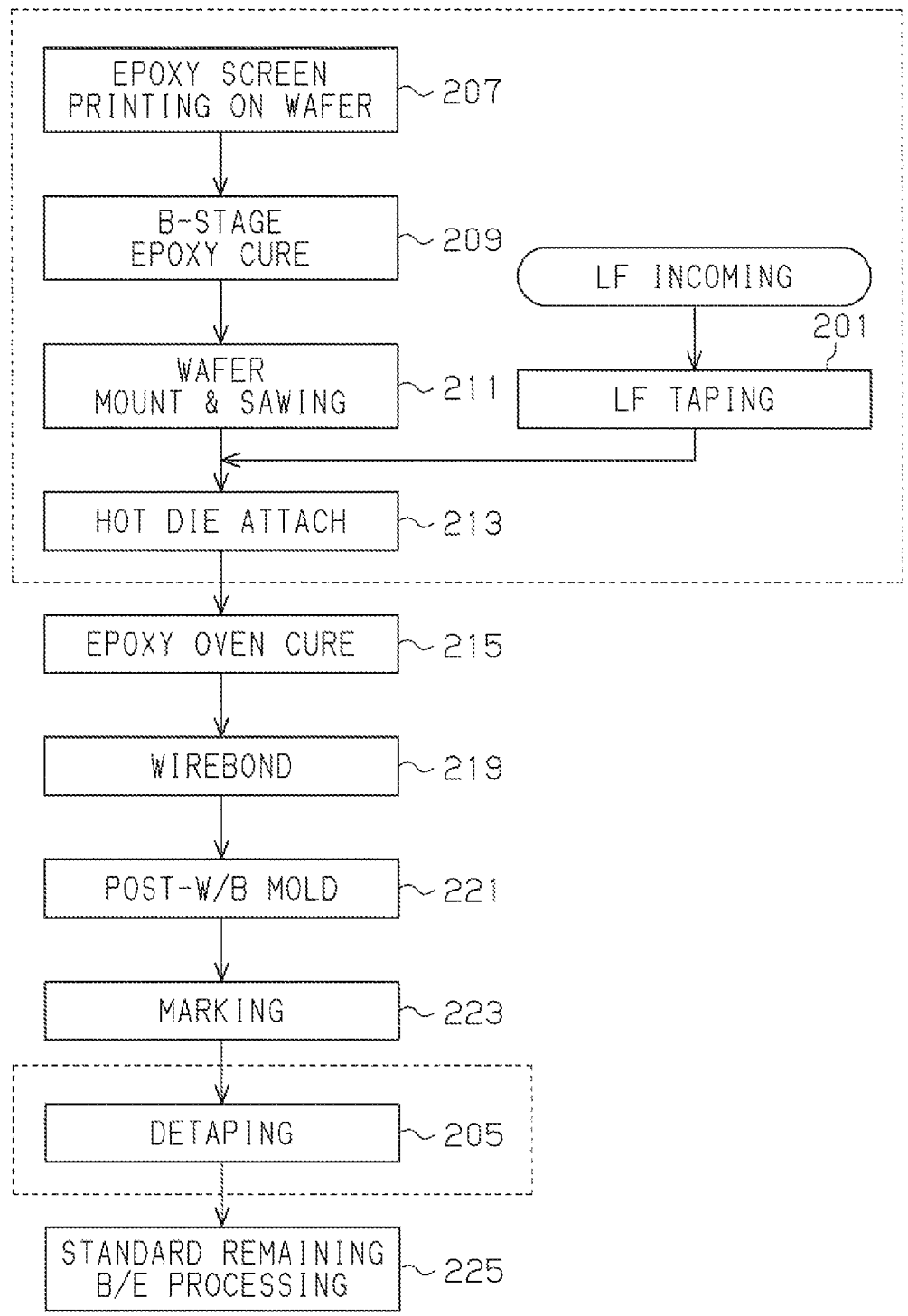
FIG. 2 is a flow chart of a conventional method of assembling a COL package.

The first molding operation is performed before the screen printing (step 307). In the prior art, as mentioned in the Background section (FIG. 1), the epoxy is shown between the die and the lead frame and the mold compound is that shown having an inverted T-shape in the area below the beneath the die. In the prior art, the die is attached by putting the epoxy on the die and then heating the die and epoxy and then attaching the die to the lead frame. This is called hot die attach. Note that the die is attached before the molding operation and so some of the epoxy is located over the open space above the inverted-T. Thus, there is a risk of delamination, which is the peeling away of the die from the lead frame. However, according to the COL packaging method of the present invention, after the completion of the first molding operation, the mold compound has already been injected into the inverted-T shaped area, and then the epoxy is screen printed onto the lead frame. Thus, since the first molding operation has already been completed and because the epoxy is screen printed onto only certain areas of the lead frame, contamination of the epoxy can be prevented.

In step 305, the lead frame is detaped. In the prior art, the detaping process is not performed until the marking is performed. Since the maximum temperature acceptable by the tape on the back of the lead frame is no more than 170° C. (the working condition specified by the tape supplier), when the lead frame with the tape is bonded, the maximum temperature must be 170° C. or less. However, if the detaping is performed before the bonding step, then the temperature for the bonding of the lead frame is not limited by the maximum temperature that can be handled by the tape, and can be increased to about 200° C. Thus, compared with the bonding of the lead frame with the taping in the prior art, the process of the present invention can utilize a higher temperature bonding.

When the lead frame with the tape thereon is bonded, due to the limitation of the molding process on the bonding process, the parameter window usable by the bonding process is too narrow. Otherwise, a further number of disadvantages will be introduced in the molding process after the bonding. In view of the above, according to the embodiments of the present invention, the detaping is performed prior to the bonding process, thereby avoiding any such problems. In this case, the parameter window of the bonding process is enlarged.

In addition, if the lead frame with the tape is heated, some residue from the tape will remain on the back of the lead frame, and this residue can have a severe negative effect on solderability. The present invention performs the detaping before heating, thereby eliminating the potential negative effects on solderability.

In step 307, epoxy is deposited on the lead frame via a screen printing process.

The above described steps all relate to the process flow of the lead frame. The operations performed on the wafer are described below.

In step 311, the wafer is mounted and sawed to provide a plurality of singulated dies.

In step 313, one of the singulated dies is attached on the lead frame with epoxy. It should be noted that the die attach herein is performed at room temperature, which is obviously distinguished from the hot die attach performed in the prior art. It has been mentioned in the Background section that since the silver slurry of the B-stage epoxy must be cured in the conventional process, the silver slurry further must be melted in the hot die attach stage, which is the reason why a "hot" die attach is required in the prior art. However, in the present invention, such melting process is not required, thus the die attach may be performed at room temperature. In the conventional packaging process with the hot die attach process, a pause in the heating region is required so that the silver slurry may cure. In contrast, according to the present invention, the die attach is performed at room temperature and no pause in the process is required, thereby improving throughput (UPH).

After the die attach is performed, in step 315, the epoxy is cured with an oven.

Next, in step 319, the die is electrically connected to the lead frame via wire bonding. More specifically, the bond pads of the die are electrically connected with contact terminals (lead fingers) of the lead frame via wire bonding. Optionally, before the wire bonding step in step 319, a plasma cleaning step may be added, as indicated at step 317. In step 317, plasma cleaning of the surface of the die and the surface of the lead frame is performed.

Before the wire bonding step 319, plasma cleaning 317 of the pollutants on the surfaces of the die and the lead frame is performed, thereby the bonding process is greatly improved. However, if the lead frame had not already been detaped (as in the conventional process), plasma cleaning of the lead frame with tape thereon would cause the tape to undergo a reaction, and thus plasma cleaning of the pollutant on the surface of the die and the surface of the lead frame cannot be very well performed, and on the contrary, a new pollution source will be introduced.

It should be noted that in the steps mentioned above, i.e., the first molding operation, taping/detaping, epoxy screen printing, plasma cleaning, etc., easily met and more efficient process parameters can be used. One of the goals of the present invention was to avoid process parameters that affected the UPH (throughput).

After the wire bonding, in step 321, a second molding operation is performed to cover the lead frame, the die, and the wires therebetween with a mold compound.

At step 323, the surface of the die is marked, i.e., after completion of the second molding operation, printing on the die top surface is performed with a laser (laser marking step 323). Thereafter, some post-processing procedures are performed, i.e., remaining standard package processing, which is indicated at step 325 in FIG. 3.

Although the above description describes the advantages of the present invention, a summary of these advantages is given below.

1. Escape from bottle-neck process (hot die attach process) in the prior art, greatly improves UPH, and reduces cycle time.

2. Detaping is performed before the attaching and bonding, so higher temperature bonding and wider bond process parameter window are obtained than bonding with taping. No residue negative effect on solderability after the taping is heated.

3. Before the wire bonding, the plasma cleaning is performed to improve bondability. This step cannot be introduced to the conventional process because the tape is still attached to the lead frame in that process.

4. Escape from delamination risk between the epoxy and the die.

In addition, it should be noted that compared with U.S. patent application publication no. 2008/290487 discussed in the Background section, the present invention employs a different package and is an assembly process (US2008290487 discloses processes that are performed by a lead frame supplier, not an assembly plant).

Those skilled in the art should understand that the above embodiments merely provide a mode that can be carried out with respect to the present invention, rather than strictly limiting the present invention to such embodiments and steps. The scope of the present invention should be limited only by the claims. In addition, unless otherwise specifically indicated or explicitly mentioned, the respective steps of the present invention are not indispensable, and the order of performance of these steps is not necessarily the one as described in the embodiments. In addition, in the Drawings, the labeling numbers of the steps and the reference signs do not indicate that these steps must be performed in the order described. Those skilled in the art should understand that under the teaching of the Description of the present invention, some additions, deletions, changes or order adjustments can be made with respect to these steps, i.e., technical features, without departing from the scope of the claims.

What is claimed is:

1. A method of forming a Chip-On-Lead package, comprising the steps of:
   mounting and sawing a wafer to provide a plurality of singulated dies;
   performing a first molding operation on a lead frame;
   depositing epoxy on the molded lead frame via a screen printing process;
   attaching one of the singulated dies on lead fingers of the molded lead frame with the epoxy, wherein the die attach is done at room temperature;
   curing the epoxy with an oven;
   electrically connecting the die to the lead frame via wire bonding; and
   performing a second molding operation to cover the lead frame and the die with a mold compound.

2. The method of claim 1, further comprising the steps of:
   taping the lead frame before the first molding operation; and
   detaping the lead frame after the first molding operation.

3. The method of claim 1, further comprising the step of:
   plasma cleaning a surface of the die and a surface of the lead frame.

4. The method of claim 3, wherein the plasma cleaning step is performed before the wire bonding step.

5. The method of claim 1, wherein
   the first molding operation is performed before the steps of screen printing and die attaching; and
   the second molding operation is performed after the wire bonding step.

6. The method of claim 1, wherein the electrically connecting step comprises the step of connecting a bond pad of the die to a contact terminal of the lead frame via wire bonding.

7. The method of claim 1, further comprising the step of marking a surface of the die.

8. A method of forming a Chip-On-Lead package, comprising the steps of:
   taping a lead frame;
   performing a first molding operation on the taped lead frame;
   removing the tape from the lead frame after performing the first molding operation;
   screen printing a die attach epoxy the molded lead frame;
   attaching a semiconductor die on lead fingers of the molded lead frame with the die attach epoxy, wherein the die attach is done at room temperature;
   plasma cleaning a surface of the die and a surface of the lead frame;
   electrically connecting the die to the lead frame via wire bonding; and
   performing a second molding operation to cover the lead frame and the die with a mold compound.

* * * * *